(12) United States Patent
Tachibana

(10) Patent No.: US 11,085,967 B2
(45) Date of Patent: Aug. 10, 2021

(54) BATTERY CONTROL DEVICE

(71) Applicant: DENSO CORPORATION, Kariya (JP)

(72) Inventor: Yuki Tachibana, Kariya (JP)

(73) Assignee: DENSO CORPORATION, Kariya (JP)

( * ) Notice: Subject to any disclaimer, the term of this patent is extended or adjusted under 35 U.S.C. 154(b) by 274 days.

(21) Appl. No.: 16/377,349

(22) Filed: Apr. 8, 2019

(65) Prior Publication Data

US 2019/0317149 A1 Oct. 17, 2019

(30) Foreign Application Priority Data

Apr. 11, 2018 (JP) .............................. JP2018-076232

(51) Int. Cl.
*G01R 31/382* (2019.01)
*H01M 10/42* (2006.01)
*H01M 10/48* (2006.01)
*H01M 50/20* (2021.01)

(52) U.S. Cl.
CPC ........ *G01R 31/382* (2019.01); *H01M 10/425* (2013.01); *H01M 10/486* (2013.01); *H01M 50/20* (2021.01); *H01M 2010/4271* (2013.01)

(58) Field of Classification Search
USPC ......................................................... 320/132
See application file for complete search history.

(56) References Cited

U.S. PATENT DOCUMENTS

| 2010/0001693 | A1* | 1/2010 | Iida | H01M 10/425 |
| | | | | 320/134 |
| 2017/0256825 | A1* | 9/2017 | Sun | H01M 10/4257 |
| 2018/0037130 | A1* | 2/2018 | Ohkawa | B60L 53/00 |
| 2019/0317149 | A1* | 10/2019 | Tachibana | G01R 31/3828 |

* cited by examiner

*Primary Examiner* — Mohammed Alam
(74) *Attorney, Agent, or Firm* — Oliff PLC

(57) ABSTRACT

A battery control device incorporated in a battery system including a battery pack with a plurality of unit cells connected in series and a temperature sensor attached to a predetermined unit cell of the plurality of unit cells. In the battery control device, an integrated amount calculator calculates an integrated amount of current flow since start of current conduction through the battery pack. A temperature acquirer acquires a temperature of the predetermined unit cell detected by the temperature sensor as a temperature of each of the plurality of unit cells on a condition that the integrated amount of current flow calculated by the integrated amount calculator is smaller than a predetermined value.

5 Claims, 6 Drawing Sheets

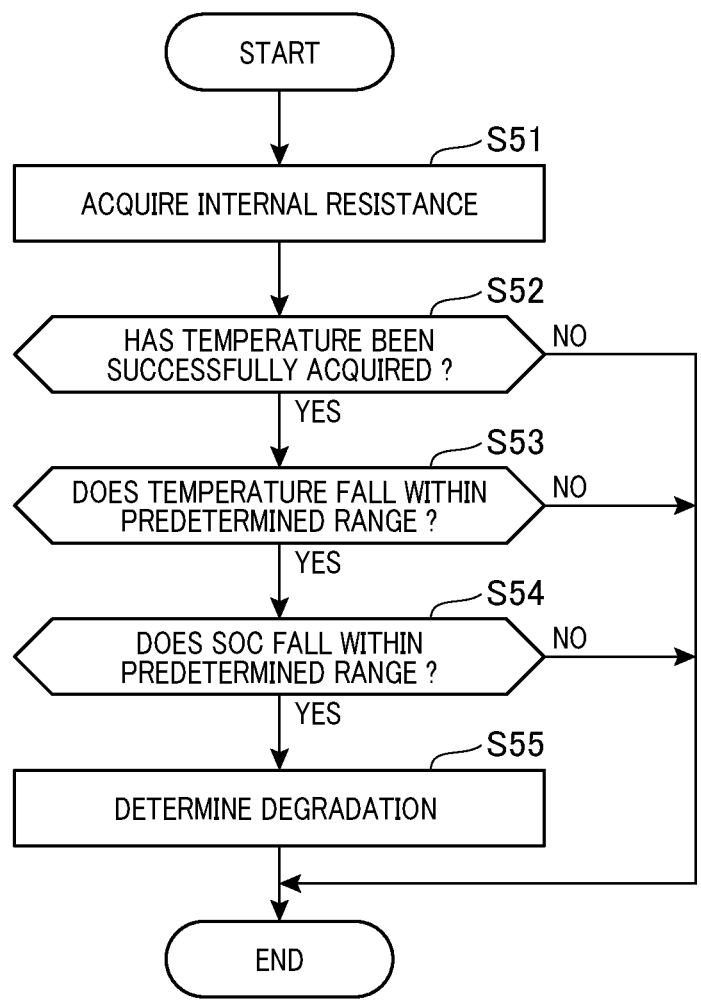

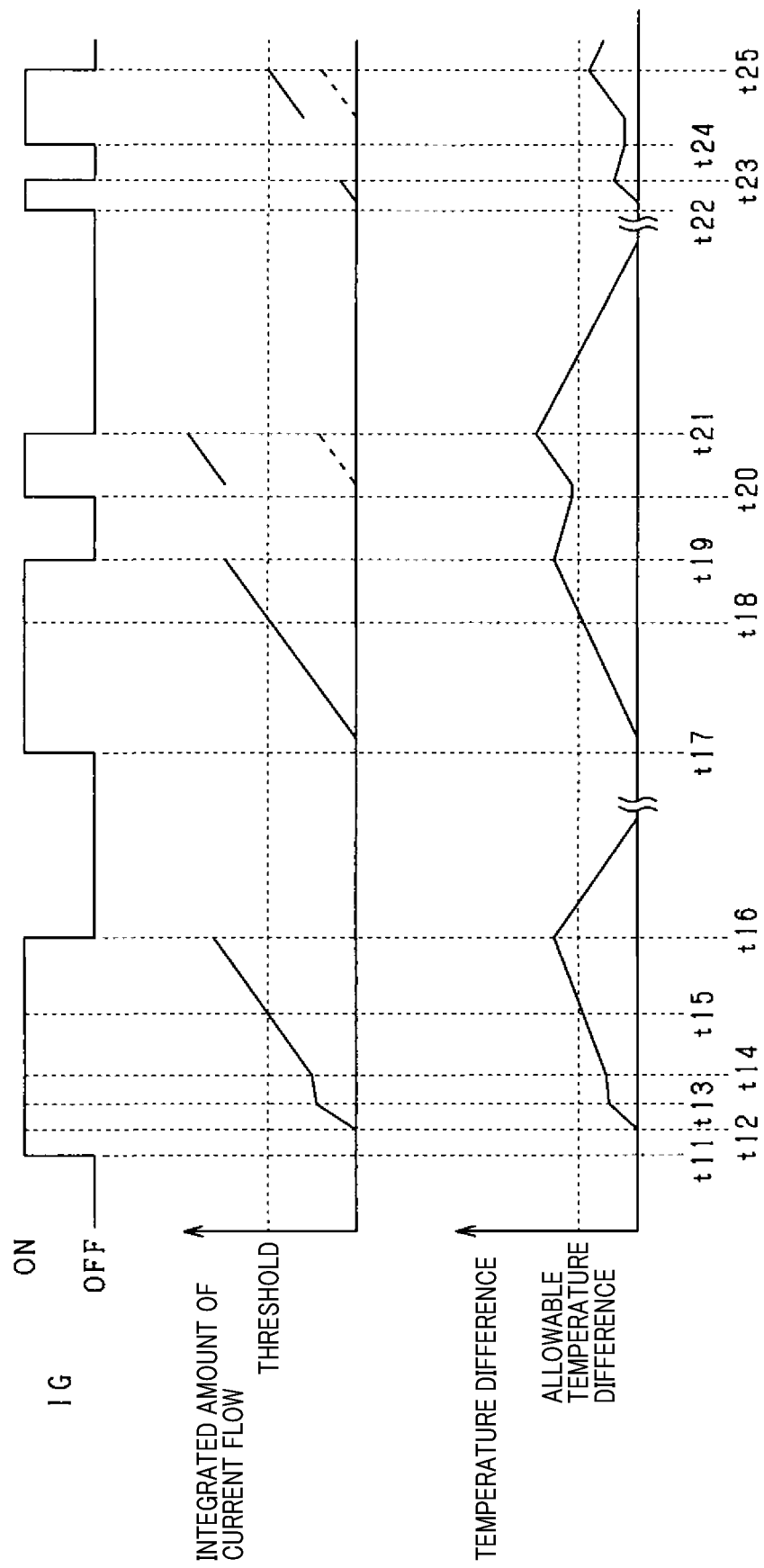

US 11,085,967 B2

BATTERY CONTROL DEVICE

CROSS-REFERENCE TO RELATED APPLICATION

This application is based on and claims the benefit of priority from earlier Japanese Patent Application No. 2018-76232 filed on Apr. 11, 2018, the description of which is incorporated herein by reference.

BACKGROUND

Technical Field

The present disclosure relates to a battery control device.

Related Art

In a power supply system using a battery including a plurality of unit cells connected in series, as the battery is progressively degraded, a charging capacity of the battery decreases and the temperature of the battery is significantly raised by heat generation. Thus, when the battery is used, a degradation status of the battery needs to be determined, and various methods are used to determine the degradation status. For example, to determine degradation of the battery, a known technique detects state of charge (SOC) and internal resistance of the battery to determine the degradation based on detected values.

The internal resistance is known to depend on temperature. Thus, for more accurate determination of the degradation, the temperature of each of the battery cells constituting the battery is desired to be detected. However, providing a temperature sensor for all the battery cells is impractical in terms of cost and space. Thus, a method is desired in which a reduced number of temperature sensors are used to acquire the temperature with a reduced error in detection for each unit cell.

There is a need for a battery control device capable of appropriately acquiring the temperature of the battery.

SUMMARY

One aspect of the present disclosure provides a battery control device incorporated in a battery system including a battery pack with a plurality of unit cells connected in series and a temperature sensor attached to a predetermined unit cell of the plurality of unit cells. In the battery control device, an integrated amount calculator calculates an integrated amount of current flow since start of current conduction through the battery pack. A temperature acquirer acquires a temperature of the predetermined unit cell detected by the temperature sensor as a temperature of each of the plurality of unit cells on a condition that the integrated amount of current flow calculated by the integrated amount calculator is smaller than a predetermined value.

BRIEF DESCRIPTION OF THE DRAWINGS

In the accompanying drawings:
FIG. 4 is a flowchart illustrating a process for determining degradation;
and
FIG. 5 is a time chart illustrating the integrated amount of current flow and a temperature difference.

DETAILED DESCRIPTION OF THE PREFERRED EMBODIMENTS

Figure 1A:
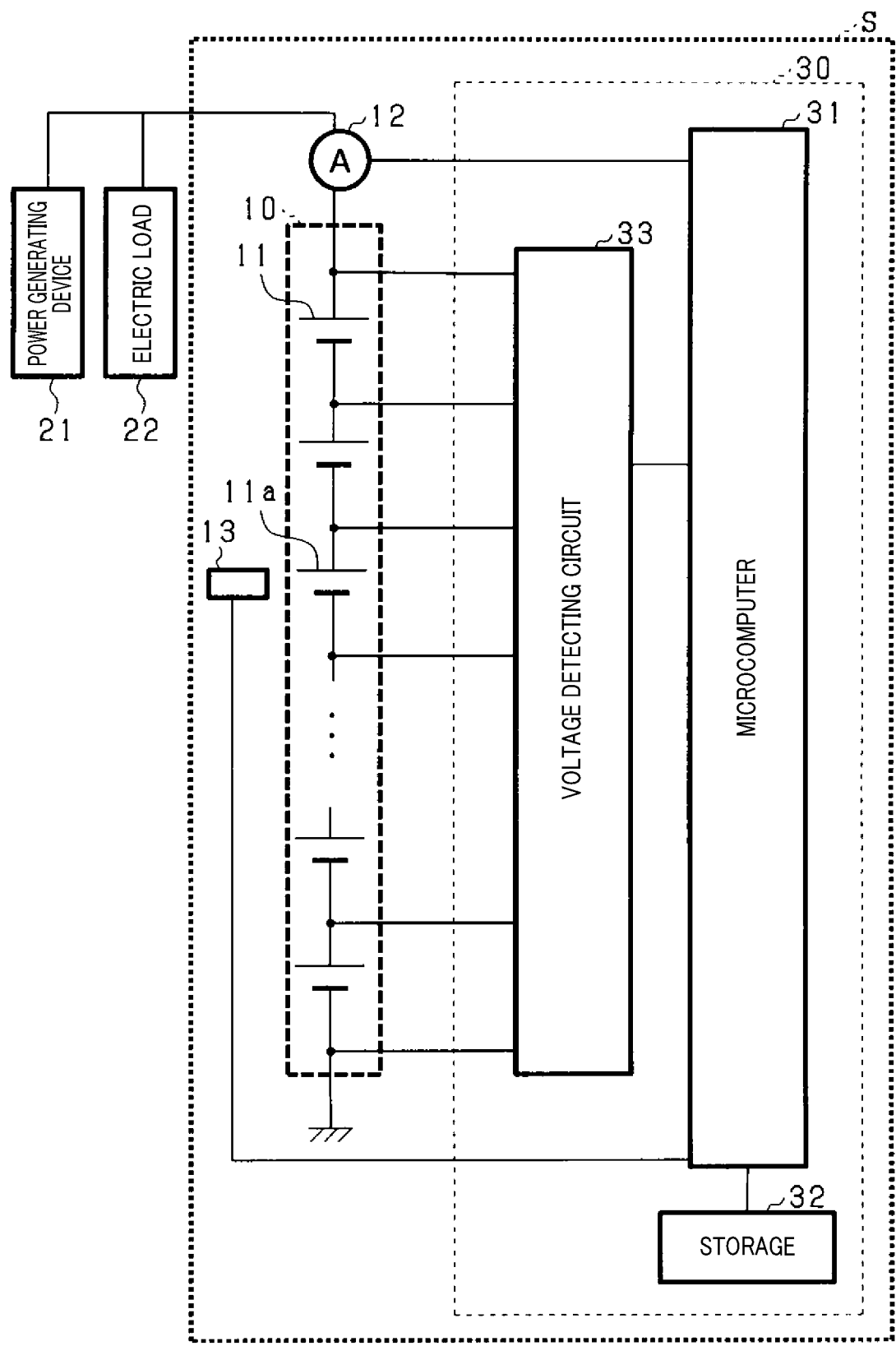
FIG. 1A is a schematic diagram of a battery system using a battery control device.

An embodiment in which a battery control device according to the present disclosure is embodied will be described below with reference to the drawings. The battery control device according to the present disclosure is used for a power supply device mounted in, for example, a hybrid car or an electric car. FIG. 1A is a schematic diagram of a configuration of a battery system using the battery control device.

As illustrated in FIG. 1A, a battery system S includes a battery pack 10. The battery pack 10 includes a plurality of unit cells 11 connected in series. The battery pack 10 is, for example, a battery (secondary battery) such as a lithium ion battery and serves as a power supply source for an in-vehicle electric load including an unillustrated traveling motor for a vehicle. The battery pack 10 is not limited to the lithium ion battery but may be another battery such as a nickel hydrogen battery so long as the battery pack 10 is a battery including a plurality of unit cells connected to supply power at a predetermined voltage.

The battery pack 10 connects in series with a current sensor 12. The current sensor 12 includes, for example, a resistance element or a current converter to measure a charge current and a discharge current flowing through the battery pack 10. In the battery pack 10, a temperature sensor 13 is attached to one predetermined unit cell 11a of the plurality of unit cells 11. The temperature sensor 13 includes, for example, a thermocouple or a thermistor to measure a temperature of the predetermined unit cell 11a.

The battery pack 10 is connected to a power generating device 21 and an electric load 22. The power generating device 21 is, for example, an alternator mounted in the vehicle to supply power to the electric load 22 and to charge the battery pack 10. The electric load 22 is, for example, a starter, any of various motors, or an ECU, and is driven by power supplied from the battery pack 10 and the power generating device 21.

The battery system S is provided with a battery control device 30 monitoring and controlling a battery status of the battery pack 10. The battery control device 30 is provided with a microcomputer 31 including a CPU, a ROM, a RAM, and a counter. In the microcomputer 31, the CPU executes various programs installed in the ROM to implement functions for battery control. The microcomputer 31 is connected to other ECUs such an engine ECU.

A storage 32 includes, for example, nonvolatile, rewritable memory to record various data about the battery pack 10. Alternatively, the storage 32 may be provided separately from but communicably with the microcomputer 31 or provided inside the microcomputer 31. A voltage detecting circuit 33 detects an inter-terminal voltage of each unit cells 11 and outputs the detected inter-terminal voltage to the microcomputer 31.

In the present embodiment, the temperature sensor 13 attached to the predetermined unit cell 11a of the plurality of unit cells 11 is used to estimate the temperature of each unit cell 11. Specifically, the integrated amount of current flow since start of current conduction or current flow through the battery pack 10 is calculated, and on the condition that the calculated integrated amount of current flow is smaller than a predetermined value, the temperature of the predetermined unit cell 11a detected by the temperature sensor 13 is acquired as the temperature of each of the plurality of unit cells 11. Furthermore, on the condition that the acquired temperature and SOC of the unit cells 11 are within predetermined ranges, internal resistance is used to determine degradation of the unit cells 11.

Figure 2:
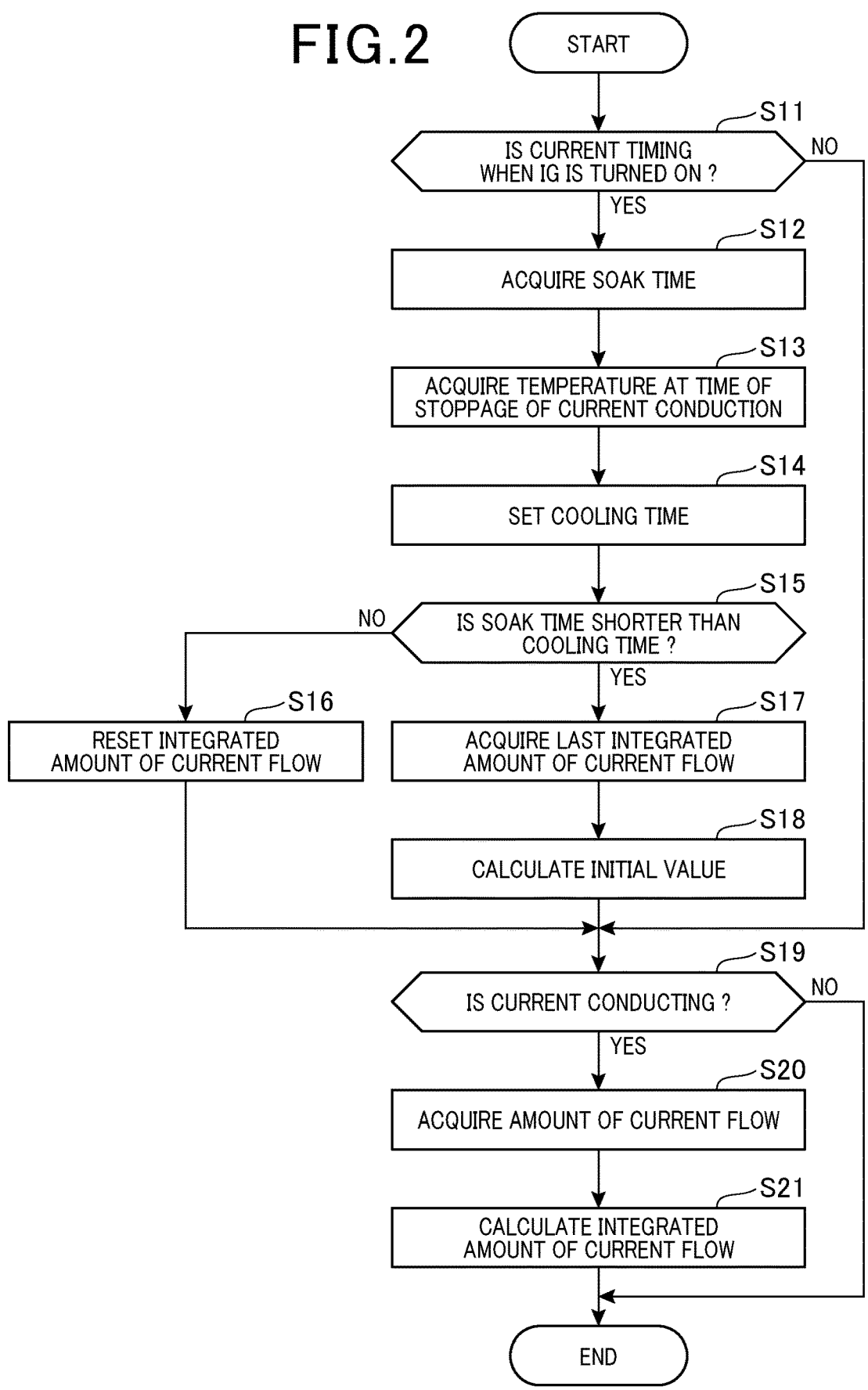
FIG. 2 is a flowchart illustrating a process for calculating an integrated amount of current flow.

A method for calculating the integrated amount of current flow will now be described using FIG. 2. FIG. 2 is a flowchart illustrating a process for calculating the integrated amount of current flow. The present process is executed with a predetermined period by the microcomputer 31 (battery control device 30) while a vehicle is in an IG on state.

Figure 1B:
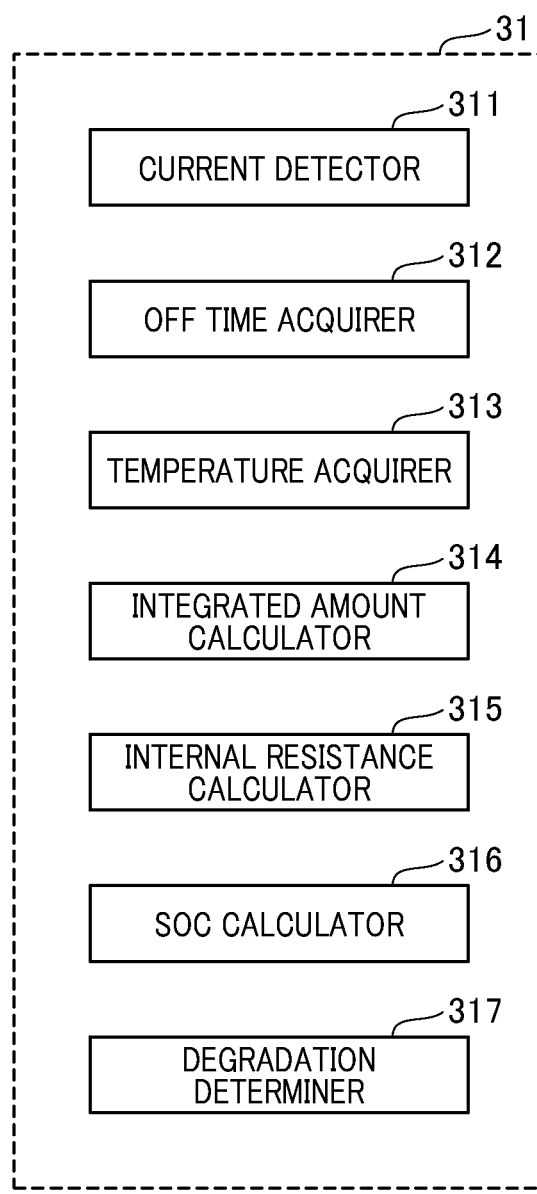
FIG. 1B is a functional block diagram of a microcomputer of the battery control device.

In step S11, the microcomputer 31 determines whether the current timing is when an IG switch is brought into an on state, that is, when the ignition is switched on. In step S11, when determining that the current timing is when the IG switch is brought into the on state, the microcomputer 31 acquires a soak time as an off time in step S12. Specifically, the soak time measured by a well-known soak timer (device measuring a time from a timing when the IG switch is brought into an off state until the IG switch is brought into the on state again) is acquired. The off time acquirer 312 of the microcomputer 31, as shown in FIG. 1B, is responsible for execution of step S12.

In step S13, the microcomputer 31 acquires an outside air temperature (environmental temperature) and the temperature detected by the temperature sensor 13 at the time of the last stoppage of current conduction or current flow (when the IG switch is brought into the off state). At the time of stoppage of current conduction (when the IG switch is brought into the off state), the temperature acquired from the temperature sensor 13 immediately before the stoppage of current conduction (last one of the values periodically acquired from the temperature sensor 13) is recorded in the storage 32 or the like, and the outside air temperature immediately before the stoppage of current conduction is also stored in an external device such as the engine ECU which is connected to the microcomputer 31.

In step S14, a predetermined cooling time is set based on the temperature at the time of the last stoppage of current conduction acquired in step S13. The time needed to cool the battery pack 10 down to the outside air temperature (environmental temperature) is calculated based on the outside air temperature and the temperature of the unit cells 11 exemplified by the predetermined unit cell 11a (detected value from the temperature sensor 13). The calculated time needed for cooling is then set as the cooling time, which is a threshold for the soak time. Thus, the cooling time set based on the temperature at the time of the last stoppage of current conduction can be more appropriate than a cooling time uniformly set regardless of the temperature. That is, the cooling time can be inhibited from being set excessively longer or shorter than the time needed to cool each unit cell 11. The time needed for cooling may be calculated using a map representing a relationship between the temperature of the unit cells 11 and the outside air temperature and the cooling time, the relationship being obtained by experiment or the like.

In step S15, the microcomputer 31 determines whether the soak time acquired in step S12 is less than the cooling time. Specifically, the microcomputer 31 determines whether the soak time is shorter than the cooling time set in step S14.

In a case where the microcomputer 31 determines in step S15 that the cooling time is longer than or equal to the predetermined time, that is, in a case where the determination in step S15 is "NO", the microcomputer 31 resets the integrated amount of current flow to 0 in step S16. In other words, the needed cooling time has been provided and the temperature of the battery pack 10 is equal to or lower than the outside air temperature, and thus, an initial value of the integrated amount of current flow is set to 0 regardless of the integrated amount of current flow during a last trip. The trip refers to a period from turn-on of the IG switch until turn-off of the IG switch.

On the other hand, in a case where the microcomputer 31 determines in step S15 that the cooling time is shorter than the predetermined time, that is, in a case where the determination in step S15 is "YES", the microcomputer 31 acquires the integrated amount of current flow during the last trip in step S17. In step S18, depending on the integrated amount of current flow during the last trip, the microcomputer 31 sets this amount as an initial value for the current trip. Specifically, the microcomputer 31 executes subtraction on the integrated amount of current flow during the last trip based on the soak time to set the resultant value as the initial value. Alternatively, the integrated amount of current flow during the last trip may be directly used without subtraction. Alternatively, a map or the like may be preliminarily created that is used to set the initial value based on a relationship between the soak time and the integrated amount of current flow, and based on the map, the initial value may be calculated by, for example, executing subtraction or addition on or maintaining the last integrated amount of current flow. Furthermore, in a case where the integrated amount of current flow during the last trip is larger than a threshold for the integrated amount of current flow described below, a value larger than the threshold for the integrated amount of current flow may be uniformly set as the initial value regardless of the soak time.

In a case where the microcomputer 31 determines in step S11 that the current timing is not when the IG switch is brought into the on state or after the initial value is set in step S16 and step S18, the microcomputer 31 determines in step S19 whether a current is conducting. Specifically, the microcomputer 31 determines whether the current sensor 12 is detecting a current value.

In step S20, the amount of current flow is acquired. Specifically, the microcomputer 31 acquires the value of the charge and discharge currents of the battery pack 10 measured by the current sensor 12 from a timing when the last amount of current flow is acquired until a timing in step S20. Alternatively, the current value acquired as in the case of step S11 may be acquired as the amount of current flow.

In step S19, the integrated amount of current flow is calculated. Specifically, at the first time during a trip, the integrated amount of current flow is set to the initial value. At the second and subsequent times, the amount of current acquired in step S20 is added to the recorded integrated amount of current flow calculated in the last step S21 to obtain a new integrated amount of current flow. The calculated integrated amount of current flow is recorded in the storage 32 or the microcomputer 31, and the process is ended. The integrated amount calculator 314 of the microcomputer 31, as shown in FIG. 1B, is responsible for execution of step S21.

Figure 3:
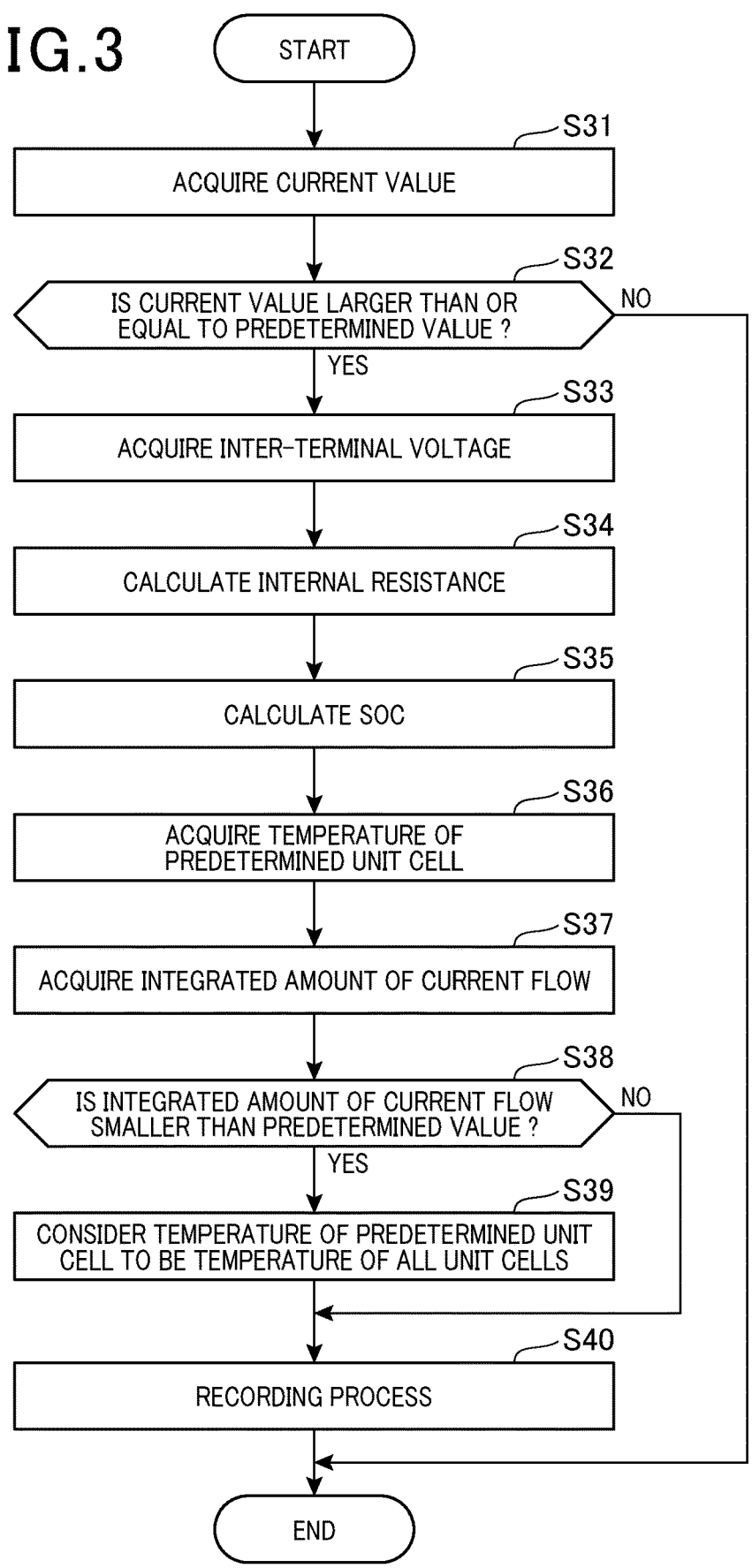
FIG. 3 is a flowchart illustrating a process for calculating an internal resistance.

A manner of calculating the internal resistance will now be described using FIG. 3. FIG. 3 is a flowchart illustrating a process for calculating the internal resistance of each unit cell 11. The present process is executed with a predetermined period by the microcomputer 31 (battery control device 30) while the vehicle is in the IG on state. The present process is executed on each unit cell 11.

In step S31, the microcomputer 31 acquires the current value of the charge and discharge currents flowing through the battery pack 10. Specifically, the microcomputer 31 acquires the current value of the charge and discharge currents of the battery pack 10 measured by the current sensor 12. The current detector 311 of the microcomputer 31, as shown in FIG. 1B, is responsible for execution of step S31.

The microcomputer 31 determines in step S32 whether the acquired current value is larger than or equal to a predetermined value. In a case where the current value of the flowing charge and discharge currents is not larger than or equal to the predetermined value, a significant error is involved in calculation of the internal resistance. Thus, the current value of the flowing charge and discharge currents is preferably larger than or equal to the predetermined value when the internal resistance is calculated. Thus, in step S32, in a case where the current value of the charge and discharge currents is not larger than or equal to the predetermined value, the process of calculating the internal resistance (present process) is ended. In a case of determining in step S32 that the current value of the charge and discharge currents is larger than or equal to the predetermined value, the microcomputer 31, at step S33, acquires the inter-terminal voltage of each unit cell 11 from the voltage detecting circuit 33.

In step S34, the internal resistance of each unit cell 11 is calculated. The inter-terminal voltage of the unit cell 11 is divided by the current value acquired in step S31 to calculate the internal resistance value. The internal resistance calculator 315 of the microcomputer 31, as shown in FIG. 1B, is responsible for execution of step S34.

In step S35, the state of charge (SOC) of each unit cell 11 is calculated using a well-known method. For example, the SOC is calculated by executing addition or subtraction of the value of the charge and discharge currents on the last value of the SOC. Furthermore, the method for calculating the SOC may be used based on the inter-terminal voltage or the SOC of the unit cell 11 may be estimated from the SOC of the battery pack 10. The SOC calculator 316 of the microcomputer 31, as shown in FIG. 1B, is responsible for execution of step S35.

In step S36, the temperature of the predetermined unit cell 11a is acquired. Specifically, the temperature of the predetermined unit cell 11a is acquired that is measured by the temperature sensor 13 attached to the predetermined unit cell 11a. In step S37, the integrated amount of current flow is acquired. Specifically, the integrated amount of current flow calculated based on the flowchart in FIG. 2 is acquired.

In step S38, the microcomputer 31 determines whether the integrated amount of current flow is smaller than a predetermined value. Specifically, in a case where the integrated amount of current flow acquired in step S37 is smaller than a threshold, the process proceeds to step S39. On the other hand, in a case where the integrated amount of current flow is larger than or equal to the threshold, the process proceeds to step S40. The threshold is calculated by experiment or simulation based on the maximum allowable temperature difference among cells. Furthermore, not only an upper limit but also a lower limit may be imposed on the integrated amount of current flow. For example, the lower limit may be imposed on the integrated amount of current flow to eliminate an initial unstable state following the ignition switch being brought into the on state.

In step S39, the temperature of the unit cells 11 is acquired by considering the temperature of the predetermined unit cell 11a acquired in step S14 to be the temperature of the unit cells 11 for which the internal resistance has been calculated. The temperature acquirer 313 of the microcomputer 31, as shown in FIG. 1B, is responsible for execution of step S20.

In step S40, the microcomputer 31 records the internal resistance calculated in step S34, the SOC calculated in step S35, and the temperature acquired in step S39, in the storage 32 in association with one another, and ends the process. In a case where the temperature fails to be acquired in step S39, that is, in a case where the microcomputer 31 determines in step S38 that the integrated amount of current flow is larger than or equal to the predetermined value, the failure to acquire the temperature of the unit cells 11 is recorded.

Degradation determination will now be described. FIG. 4 is a flowchart illustrating a process for determining degradation. The present process is executed with a predetermined period by the microcomputer 31 (battery control device 30) while the vehicle is in the IG on state.

In step S51, the microcomputer 31 acquires the internal resistance and the like recorded in association with one another as illustrated in the flowchart in FIG. 3. Specifically, the microcomputer 31 acquires the internal resistance, the SOC, and the temperature of the unit cells 11 recorded in the storage 32 in association with one another.

In step S52, the microcomputer 31 determines whether the temperature of the unit cells 11 has been acquired in step S51. In a case where the microcomputer 31 determines in step S38 in FIG. 3 that the integrated amount of current flow is smaller than the predetermined value, the temperature of the unit cells 11 is recorded in the storage 32. Thus, the determination in step S52 is affirmative. On the other hand, in a case where the microcomputer 31 determines in step S38 in FIG. 3 that the integrated amount of current flow is larger than or equal to the predetermined value, a failure to acquire the temperature of the unit cells 11 is recorded in the storage 32. Thus, the determination in step S52 is negative, and the process is ended.

In step S53, the microcomputer 31 determines whether the temperature of the unit cells 11 acquired in step S18 is within a predetermined range. The value of the internal resistance depends on the temperature, and thus, a region where degradation determination can be made is defined as a predetermined range of the temperature. In a case where the temperature is outside the predetermined range, the process is ended without execution of degradation determination.

In step S54, the microcomputer 31 determines whether the SOC calculated in step S15 is within a predetermined range. The value of the internal resistance depends on the SOC, and thus, a region where degradation determination can be made is defined as a predetermined range of the SOC. In a case where the temperature is outside the predetermined range, the process is ended without execution of degradation determination.

In step S55, degradation determination is made by a well-known method based on the value of the internal resistance acquired in step S51. For example, in a case where the value of the internal resistance exceeds a threshold, the microcomputer 31 determines that unit cell 11 of interest is correspondingly degraded. The microcomputer 31 then records the result of degradation determination in the storage 32, and ends the process. The degradation determiner 317 of the microcomputer 31, as shown in FIG. 1B, is responsible for execution of step S55.

A relationship between the integrated amount of current flow and temperature differences among the unit cells 11 will now be described using FIG. 5. FIG. 5 is a timing chart indicating a relationship between the state of the IG switch and the integrated amount of current flow and the temperature differences among the unit cells 11.

First, when the IG switch is turned on at timing t11, the initial value of the integrated amount of current flow is calculated in accordance with the soak time since the last turn-off of the IG switch. At this timing, the soak time since the last timing when the IG switch is brought into the off state is longer than the time needed for cooling. Thus, the initial value of the integrated amount of current flow is set to 0. Furthermore, the sufficient soak time has made the temperature of each unit cell 11 equal to the outside air temperature, leading to a zero temperature difference among the unit cells 11.

Furthermore, turn-on of the IG switch causes a start-up process to be executed with the battery pack 10 to start current conduction at timing t12. When the current conduction is started, the value of the charge and discharge currents of the battery pack 10 is integrated to calculate the integrated amount of current flow, and the value of the integrated amount of current flow increases. Furthermore, the start of the current conduction increases the temperature of each unit cell 11, leading to temperature differences among the unit cells 11.

Even when the IG switch is in the on state, no charge or discharge current may flow due to a factor such as the state of the battery pack 10 or the electric load 22 as in the case of timing t13 to timing t14. In this case, the integrated amount of current flow maintains the same value. During timing t13 to timing t14, while the current value is 0, the internal resistance is not calculated.

At and before timing t15 and while the integrated amount of current flow is smaller than the threshold and the current value is larger than or equal to the predetermined value (during timing t12 to timing t13 and during timing t14 to timing t15), the internal resistance is calculated. Furthermore, the temperature of the predetermined unit cell 11a is acquired as the temperature of the unit cells 11 so as to be recorded with the calculated internal resistance. Degradation determination is then made using the internal resistance, the SOC, and the temperature of the unit cells 11 calculated and recorded in association with one another during the above-described periods. The threshold for the integrated amount of current flow is set to have a slight margin enough to prevent each of the temperature differences among the unit cells 11 from exceeding an allowable temperature difference at timing t15, when the integrated amount of current flow exceeds the threshold.

At timing t15, when the integrated amount of current flow is larger than or equal to the threshold, each the temperature differences among the unit cells 11 exceeds the allowable temperature difference. This disables, during timing t15 to timing t16, acquisition of the temperature of the predetermined unit cell 11a as the temperature of each unit cell 11, precluding the internal resistance during this period from being used for degradation determination. However, calculating the internal resistance once during one trip is sufficient, the internal resistance being capable of being used for degradation determination. Thus, there is no problem with the presence of the period from timing t15 to timing t16 and the like when the microcomputer 31 is precluded from acquiring the temperature of the predetermined unit cell 11a as the temperature of each unit cell 11.

At timing t16, the IG switch is brought into the off state. Then, the integrated amount of current flow no longer increases, and the value recorded in the storage 32 remains unchanged. Furthermore, when the IG switch is brought into the off state, the temperature of each unit cell 11 decreases down to the external environmental temperature, and thus, the temperature differences also gradually decrease.

At timing t17, the IG switch is brought into the on state again. In a case where the soak time is sufficient, in other words, in a case where a sufficient time has elapsed since timing t16 (last trip) corresponding to the last turn-off of the IG switch, the initial value of the integrated amount of current flow is set to 0. Then, the temperature of the predetermined unit cell 11a can be acquired as the temperature of the unit cells 11 until timing t18 when the integrated amount of current flow during the current trip exceeds the threshold (during timing t17 to timing t18). Degradation determination is then made using the internal resistance, the SOC, and the temperature of the unit cells 11 calculated and recorded in association with one another during the above-described period.

At timing t19, the IG switch is brought into the off state to stop the current conduction. Then, the integrated amount of current flow no longer increases, and the value recorded in the storage 32 remains unchanged. Furthermore, when the IG switch is brought into the off state, the temperature of each unit cell 11 decreases down to the external environmental temperature, and thus, the temperature differences also gradually decrease.

With the soak time shorter than the predetermined cooling time, in other words, with the temperature differences among the unit cells 11 remaining from the last trip (during timing t17 to timing t19), the IG switch is brought into the on state at timing t20. In this case, the initial value is calculated in accordance with the integrated amount of current flow during the last trip, and even the initial value of the integrated amount of current flow exceeds the threshold. Thus, even in a case where the integrated amount of current flow (the integrated amount of current flow except for the initial value) during the current trip is smaller than the threshold as illustrated by a dashed line, the microcomputer 31 avoids acquiring the temperature of the predetermined unit cell 11a as the temperature of each unit cell 11 until the IG switch is turned off (during timing t20 to timing t21). In a case where the soak time is insufficient, the microcomputer 31 takes into account the temperature differences among the unit cells 11 remaining from the current conduction during the last trip by setting the initial value of the integrated amount of current flow in accordance with the integrated amount of current flow during the last trip.

Furthermore, the IG switch is brought into the on state again at timing t22 when the soak time is longer than or equal to the predetermined cooling time. At timing t23, before the integrated amount of current flow exceeds the threshold, the IG switch is brought into the off state.

With the soak time shorter than the predetermined cooling time, in other words, with the temperature differences among the unit cells 11 remaining from the last trip (during timing t22 to timing t23), the IG switch is brought into the on state at timing t24. In this case, the initial value is calculated in accordance with the integrated amount of current flow during the last trip. The integrated amount of current flow during the last trip does not exceed the threshold, and thus, the initial value during the current trip (during timing t24 to timing t25) also does not exceed the threshold. Thus, the temperature of the predetermined unit cell 11a can be acquired as the temperature of each unit cell 11 until the integrated amount of current flow corresponding to the sum of the integrated amount of current flow during the current trip and the initial value exceeds the threshold as illustrated by a dashed line (during timing t24 to timing t25). Thus, the degradation determination is made using the internal resistance, the SOC, and the temperature of the unit cells 11 calculated and recorded in association with one another during the above-described period.

As described above, even in a case where the soak time is insufficient, the initial value of the integrated amount of current flow is set smaller than the threshold in a case where the integrated amount of current flow during the last trip is smaller than the threshold. Thus, the microcomputer 31 can acquire the temperature of the predetermined unit cell 11a as the temperature of each unit cell 11 while taking into account the temperature differences among the unit cells 11 remaining from the current conduction during the last trip (while taking over the value of the integrated amount of current flow from the last trip). The microcomputer 31 can thus make degradation determination based on the internal resistance.

As described above, the temperature differences among the unit cells 11 increase consistently with integrated amount of current flow. Thus, the temperature of the predetermined unit cell 11a can be acquired as the temperature of each unit cell 11 on the condition that the integrated amount of current flow is within the predetermined range (the integrated amount of current flow is smaller than the threshold). Furthermore, when the soak time is longer than or equal to the predetermined time, the temperature differences among the unit cells 11 caused during the last trip are eliminated. On the other hand, in a case where the soak time is shorter than the predetermined time, the temperature differences remaining from the last trip can be taken into account by calculating the initial value of the current integrated amount of current flow using the integrated amount of current flow during the last trip.

According to the above-described embodiment, the following effects are produced.

While the battery is in use and the calculated integrated amount of current flow is smaller than the predetermined value, each of the temperature differences is estimated to be within the predetermined range. The temperature from the temperature sensor 13 attached to the predetermined unit cell 11a is acquired as the temperature of each unit cell 11. In a case where the integrated amount of current flow is smaller than the predetermined value, the temperature differences are small and all the unit cells 11 can be considered to have the same temperature. Thus, imposing limitation based on the integrated amount of current flow allows improvement of reliability for a case where the measured temperature of the predetermined unit cell 11a is used as the temperature of each unit cell 11. Then, the temperature of each unit cell 11 can be accurately acquired with an increase in the number of temperature sensors 13 suppressed.

In a case where not much time has elapsed since the last current conduction, temperature differences among the unit cells 11 caused during the last trip may remain. Thus, the soak time is measured that lasts from the timing when the IG switch is brought into the off state until the subsequent timing when the IG switch is brought into the on state. In a case where the soak time is longer than or equal to the cooling time, the temperature differences during the last trip are considered to have been eliminated. Thus, the integrated amount of current flow is reset and the current integrated amount of current flow is calculated. On the other hand, in a case where the soak time is shorter than the cooling time, the temperature differences during the last trip are considered to remain. Thus, the last integrated amount of current flow is used to calculate the current integrated amount of current flow. The integrated amount of current flow is calculated in view of the soak time to allow the temperature differences remaining from the last trip to be taken into account. This enables more accurate determination of whether the temperature differences are each within the predetermined range.

The battery temperature at the time when the IG switch is brought into the off state varies, and it is contemplated that the battery temperature varies the time needed to cool each unit cell 11, that is, the time until the temperatures of the unit cells 11 reach the same value. Thus, as an example of the temperature of each unit cell 11, the temperature of the predetermined unit cell 11a is acquired that is detected by the temperature sensor 13 at the time when the IG switch is brought into the off state. Based on this temperature, the needed cooling time is set. The thus set predetermined time is more suitable than a uniformly set predetermined time and consistent with the temperature during the last current conduction. This allows more appropriate determination of whether the temperature differences have been eliminated during the soak time.

Furthermore, the charge and discharge currents of the battery pack 10 are detected, and the integrated value of the detected currents is calculated as the integrated amount of current flow. Thus, the integrated amount of current flow can be more accurately calculated. This allows more accurate estimation of whether the temperature differences among the unit cells 11 are each within the predetermined range.

It is sufficient to make the degradation determination based on the internal resistance approximately once during current conduction (trip) through the battery pack 10, and the degradation determination based on the internal resistance need not be constantly made during the current conduction through the battery pack 10. Thus, even when acquisition of the temperature is limited to the case where the integrated amount of current flow is smaller than the predetermined value as is the case with the present embodiment, the degradation determination can be sufficiently achieved. The degradation of each unit cell 11 is determined when the acquired temperature and SOC of the unit cell 11 are within the predetermined ranges. Thus, the degradation determination can be accurately achieved.

For calculation of the internal resistance, the charge and discharge currents flowing through the battery preferably have a predetermined value or larger. Thus, the internal resistance of each unit cell 11 is calculated based on the current value and the inter-terminal voltage of the unit cell 11 in a case where the charge and discharge currents flowing through the battery have the predetermined value or larger. Furthermore, the degradation determination needs the temperature obtained at the timing when the internal resistance is calculated. Thus, the temperature acquirer acquires, as the temperature of each unit cell 11, the temperature from the temperature sensor 13 attached to the predetermined unit cell 11a in the case where the charge and discharge currents flowing through the battery have the predetermined value or larger.

For the purposes of summarizing the disclosure, a battery control device 30 incorporated in a battery system S including a battery pack 10 with a plurality of unit cells 11 connected in series and a temperature sensor 13 attached to a predetermined unit cell 11a of the plurality of unit cells is provided. The battery control device 30 includes an integrated amount calculator 314 calculating an integrated amount of current flow since start of current conduction through the battery pack 10, and a temperature acquirer 313 acquiring a temperature of the predetermined unit cell 11a detected by the temperature sensor as a temperature of each of the plurality of unit cells on a condition that the integrated amount of current flow calculated by the integrated amount calculator 314 is smaller than a predetermined value.

All the unit cells are considered to have substantially the same temperature as an external environmental temperature when the use of the battery pack 10 is started. When a current flows through the battery pack 10, differences in internal resistance among the unit cells 11 and arrangement of the unit cells 11 vary the temperature among the unit cells 11 of the battery pack 10, in other words, lead to temperature differences in maximum temperature and minimum temperature among the unit cells 11. The temperature differences among the unit cells 11 of the battery pack 10 gradually increase consistently with the integrated amount of current flow since the start of current conduction.

Thus, in a case where the calculated integrated amount of current flow is smaller than the predetermined value, each of the temperature differences is estimated to be smaller than a predetermined value, and the temperature from the temperature sensor attached to the predetermined unit cell 11a is acquired as the temperature of each of the plurality of unit cells 11. In a case where the integrated amount of current flow is smaller than the predetermined value, the temperature differences are small and all the unit cells 11 can be considered to have the same temperature. Thus, imposing limitation based on the integrated amount of current flow allows improvement of reliability for a case where the temperature measured for the predetermined unit cell 11a is used as the temperature of each unit cell. Then, the temperature of each unit cell can be accurately acquired with an increase in the number of temperature sensors suppressed.

The battery control device 30 may include an off time acquirer 312 acquiring a result of measurement of an off time from stoppage of current conduction through the battery pack 10 until subsequent resumption of current conduction through the battery pack 10, and the integrated amount calculator 314 resets and calculates the integrated amount of current flow when current conduction is resumed in a case where the off time is more than or equal to a predetermined value, while using a last integrated amount of current flow to calculate the integrated amount of current flow when current conduction is resumed in a case where the off time is less than the predetermined value.

In a case where not much time has elapsed since the last current conduction, temperature differences among the unit cells 11 caused during the last current conduction may remain. Thus, the off time is measured that lasts from stoppage of current conduction until subsequent resumption of current conduction. The temperature differences during the last current conduction are considered to have been eliminated in a case where the off time is longer than or equal to a predetermined time. Thus, the integrated amount of current flow is reset and the current integrated amount of current flow is calculated. On the other hand, the temperature differences during the last current conduction are considered to remain in a case where the off time is shorter than the predetermined time. Thus, the last integrated amount of current flow is used to calculate the current integrated amount of current flow. The integrated amount of current flow is calculated in view of the off time to allow the temperature differences from the last current conduction to be taken into account. This enables more accurate determination of whether the temperature differences are each within a predetermined range.

The integrated amount calculator 314 may set the predetermined time based on a temperature detected by the temperature sensor at a time of last stoppage of current conduction.

The battery temperature at the time of the stoppage of current conduction varies, and it is contemplated that this battery temperature varies a time needed to cool each unit cell, that is, the amount of time until the temperatures of the unit cells 11 reach the same value. Thus, as an example of the temperature of each unit cell, the temperature of the predetermined unit cell 11a is acquired that is detected by the temperature sensor at the time of the stoppage of current conduction. Based on this temperature, a needed predetermined time is set. Accordingly, the thus set predetermined time is more suitable than a uniformly set predetermined time and consistent with the temperature during the last current conduction. This allows more appropriate determination of whether the temperature differences have been eliminated during the off time.

The battery control device 30 may include a current detector 311 detecting a charge current and a discharge current of the battery pack 10. The integrated amount calculator 314 calculates, as the integrated amount of current flow, an integrated value of a current detected by the current detector 311 after the start of current conduction.

The charge and discharge currents of the battery pack 10 are detected, and the integrated value of the detected currents is calculated as the integrated amount of current flow. Thus, the integrated amount of current flow can be more accurately calculated. This allows more accurate estimation of whether the temperature differences among the unit cells 11 are each within a predetermined range.

The battery control device 30 may include an internal resistance calculator 315 calculating an internal resistance of each of the unit cells 11, an SOC calculator 316 calculating SOC of the unit cell, and a degradation determiner 317 determining degradation of the unit cell using the internal resistance on a condition that the SOC of the unit cell and the temperature of the unit cell acquired by the temperature acquirer 313 when the internal resistance is calculated by the internal resistance calculator 315 are within predetermined ranges.

It is sufficient to determine degradation based on the internal resistance approximately once during current conduction through the battery pack 10, and the degradation determination based on the internal resistance need not be constantly performed during the current conduction through the battery pack 10. Thus, even when acquisition of the temperature is limited to the case where the integrated amount of current flow is smaller than the predetermined value as is the case with the first means, the degradation determination can be sufficiently achieved. The degradation of each unit cell is determined when the acquired temperature and SOC of the unit cell are within the predetermined ranges. Thus, the degradation determination can be accurately achieved.

The internal resistance calculator 315 may calculate the internal resistance based on a current value and an inter-terminal voltage of each of the unit cells 11 in a case where the charge and discharge currents of the battery pack 10 have a predetermined value or larger.

For calculation of the internal resistance, the charge and discharge currents flowing through the battery preferably have a predetermined value or larger. Thus, the internal resistance of each unit cell is calculated based on the current value and the inter-terminal voltage of the unit cell obtained in a case where the charge and discharge currents flowing through the battery have the predetermined value or larger. Furthermore, the degradation determination needs the temperature obtained at the timing when the internal resistance is calculated. Thus, the temperature acquirer 313 acquires the temperature from the temperature sensor attached to the predetermined unit cell 11a in the case where the charge and discharge currents flowing through the battery have the predetermined value or larger.

MODIFICATIONS

The present disclosure is not limited to the above-described embodiment and may be implemented, for example, as described below. Configurations in the following other examples may each be applied separately from or optionally combined with the configuration of the above-described embodiment.

(M1) The timing of the start of current conduction corresponding to a start point for calculation of the integrated amount of current flow may be, instead of turn-on of the IG switch, the start of current conduction following the charge and discharge currents becoming zero. In this case, in the flowchart in FIG. 2, the determination in step S11 may include determining whether the current timing is when the current conduction is resumed. Then, in step S12, the time is acquired that lasts from the timing when the charge and discharge currents become zero until the current conduction is started again. In step S13, the temperature is acquired from the temperature sensor 13 immediately before the stoppage of current conduction. In step S14, the cooling time is set. The microcomputer 31 determines in step S15 whether the time acquired in step S12 is shorter than the cooling time, and in step S17, acquires, as the last integrated amount of current flow, the integrated amount of current flow measured before the charge and discharge currents become zero.

In such a case, as illustrated in the timing chart in FIG. 5, timing t14 is the timing for the start of current conduction corresponding to the start point for calculation of the integrated amount of current flow. Furthermore, the off time is a time from timing t13 when the amount of current becomes zero until timing t14 when the current conduction is started again. The microcomputer 31 sets the cooling time based on the temperature at timing t13, and determines whether the off time from timing t13 to timing t14 is shorter than the cooling time. When the off time from timing t13 to timing t14 is shorter than the cooling time, the microcomputer 31 uses the integrated amount of current flow during timing t12 to timing t13 to calculate the initial value of the integrated amount of current flow at and after timing t14.

(M2) In a case where, in step S15 in FIG. 2, the soak time is shorter than the predetermined time, step S17 may be omitted, and the initial value calculated in step S18 may be set larger than or equal to the threshold for the integrated amount of current flow. In other words, in a case where the soak time (off time) is shorter than the predetermined time, the threshold for the integrated amount of current flow may be set to be constantly exceeded. In this case, the temperature of the predetermined unit cell 11a is not considered to be the temperature of each unit cell 11, and the degradation determination is not performed.

(M3) The cooling time may be uniformly set. In this case, the cooling time may be set on the assumption of a case where the temperature differences among the unit cells 11 are maximized.

(M4) The integrated amount of current flow may be calculated using the time for which the charge and discharge currents have a predetermined value or larger.

(M5) The method for acquiring the temperature of each unit cell 11 according to the present embodiment may be used for applications other than the degradation determination based on the internal resistance. For example, the temperature of each unit cell 11 acquired by this method may be used to detect an abnormality in the unit cell 11. In this case, this method may be used to acquire the temperature in a case where the integrated amount of current flow is within the predetermined range. Another well-known temperature estimating method may be used in a case where the integrated amount of current flow is outside the predetermined range.

(M6) The number of temperature sensors 13 is not limited to one so long as the number is smaller than the number of unit cells 11. For example, in a case where the temperature sensor 13 is attached to each of a plurality of predetermined unit cells 11a, the average of the values detected by the temperature sensors 13 may be acquired as the temperature of the other unit cells 11. Furthermore, the unit cells 11 may be divided into a plurality of groups, and one temperature sensor 13 may be provided for each of the groups. The temperature detected by the temperature sensor 13 may be acquired as the temperature of the unit cells 11 of the group.

What is claimed is:

1. A battery control device incorporated in a battery system including a battery pack with a plurality of unit cells connected in series and a temperature sensor attached to a predetermined unit cell of the plurality of unit cells, the battery control device comprising:

an integrated amount calculator calculating an integrated amount of current flow since start of current conduction through the battery pack;

a temperature acquirer acquiring a temperature of the predetermined unit cell detected by the temperature sensor as a temperature of each of the plurality of unit cells on a condition that the integrated amount of current flow calculated by the integrated amount calculator is smaller than a predetermined value; and an off time acquirer acquiring an off time from stoppage of current conduction through the battery pack until subsequent resumption of current conduction through the battery pack, wherein the integrated amount calculator resets and calculates the integrated amount of current flow when current conduction is resumed in a case where the off time is more than or equal to a predetermined value, while using a last integrated amount of current flow to calculate the integrated amount of current flow when current conduction is resumed in a case where the off time is less than the predetermined value.

2. The battery control device according to claim 1, wherein the integrated amount calculator sets the predetermined time based on a temperature detected by the temperature sensor at a time of last stoppage of current conduction.

3. The battery control device according to claim 1, further comprising:

a current detector detecting a charge current and a discharge current of the battery pack, wherein the integrated amount calculator calculates, as the integrated amount of current flow, an integrated value of a current detected by the current detector after start of current conduction.

4. The battery control device according to claim 1, further comprising:
an internal resistance calculator calculating an internal resistance of each of the unit cells;
an SOC calculator calculating an SOC of the unit cell; and
a degradation determiner determining degradation of the unit cell using the internal resistance on a condition that the SOC of the unit cell and the temperature of the unit cell acquired by the temperature acquirer when the internal resistance is calculated by the internal resistance calculator are within predetermined ranges.

5. The battery control device according to claim 4, wherein
the internal resistance calculator calculates the internal resistance based on a current value and an inter-terminal voltage of each of the unit cells in a case where the charge and discharge currents of the battery pack have a predetermined value or larger.

* * * * *